United States Patent
Chinnakkonda Vidyapoornachary et al.

(10) Patent No.: US 9,921,623 B2
(45) Date of Patent: *Mar. 20, 2018

(54) IMPLEMENTING DIMM AIR FLOW BAFFLE

(71) Applicant: International Business Machines Corporation, Armonk, NY (US)

(72) Inventors: Diyanesh B. Chinnakkonda Vidyapoornachary, Bangalore (IN); Edgar R. Cordero, Round Rock, TX (US); Saravanan Sethuraman, Bangalore (IN)

(73) Assignee: International Business Machines Corporation, Armonk, NY (US)

( * ) Notice: Subject to any disclaimer, the term of this patent is extended or adjusted under 35 U.S.C. 154(b) by 356 days.

This patent is subject to a terminal disclaimer.

(21) Appl. No.: 14/696,412

(22) Filed: Apr. 25, 2015

(65) Prior Publication Data
US 2016/0224079 A1    Aug. 4, 2016

Related U.S. Application Data

(63) Continuation of application No. 14/611,480, filed on Feb. 2, 2015.

(51) Int. Cl.
*G06F 1/20* (2006.01)
*G05D 23/19* (2006.01)
*H05K 7/20* (2006.01)

(52) U.S. Cl.
CPC ......... *G06F 1/206* (2013.01); *G05D 23/1928* (2013.01); *H05K 7/20145* (2013.01); *H05K 7/20727* (2013.01)

(58) Field of Classification Search
None
See application file for complete search history.

(56) References Cited

U.S. PATENT DOCUMENTS

| | | | |
|---|---|---|---|
| 5,196,989 A * | 3/1993 | Zsolnay | H05K 7/20 165/80.3 |
| 5,263,537 A | 11/1993 | Plucinski et al. | |
| 5,793,610 A | 8/1998 | Schmitt et al. | |
| 6,011,689 A * | 1/2000 | Wrycraft | G06F 1/20 361/679.31 |
| 7,379,297 B2 | 5/2008 | Peterson et al. | |
| 7,408,774 B1 | 8/2008 | Anderi et al. | |
| 7,654,840 B1 * | 2/2010 | Zapata, IV | H01R 13/62988 361/679.54 |
| 7,684,196 B2 | 3/2010 | Eckberg et al. | |
| 7,864,541 B2 | 1/2011 | Lucero et al. | |
| 7,902,966 B1 * | 3/2011 | Beitelmal | G06F 1/206 236/49.3 |

(Continued)

OTHER PUBLICATIONS

Appendix P—List of IBM Patents or Patent Applications Treated as Related—May 5, 2015.

*Primary Examiner* — Thomas Lee
*Assistant Examiner* — Gary Collins
(74) *Attorney, Agent, or Firm* — Joan Pennington

(57) ABSTRACT

A method, system and computer program product for implementing thermal air flow control management of a computer system. A temperature profile of the server system is identified. One or more dual in-line memory-modules (DIMMs) are used to pivot on an axis to direct air flow to cool identified hot spots based upon the temperature profile of the server system.

9 Claims, 10 Drawing Sheets

(56) References Cited

U.S. PATENT DOCUMENTS

| | | |
|---|---|---|
| 8,001,407 B2 | 8/2011 | Malone et al. |
| 8,570,740 B2 | 10/2013 | Cong et al. |
| 9,060,448 B2* | 6/2015 | Lenart ................ H05K 7/20145 |
| 2007/0027580 A1* | 2/2007 | Ligtenberg ............. G05D 23/19 |
| | | 700/300 |
| 2008/0101015 A1* | 5/2008 | Peterson ................. G06F 1/206 |
| | | 361/690 |
| 2008/0117589 A1* | 5/2008 | Carrera .................... G06F 1/20 |
| | | 361/679.51 |
| 2008/0130225 A1* | 6/2008 | Gilliland ........... H05K 7/20154 |
| | | 361/695 |
| 2009/0016019 A1* | 1/2009 | Bandholz .......... H05K 7/20736 |
| | | 361/695 |
| 2009/0260795 A1* | 10/2009 | Perazzo ............ H05K 7/20572 |
| | | 165/269 |
| 2010/0097754 A1* | 4/2010 | Li ............................ G06F 1/20 |
| | | 361/679.49 |
| 2010/0167636 A1* | 7/2010 | Bhattacharya .......... G06F 1/206 |
| | | 454/239 |
| 2010/0316501 A1 | 12/2010 | Bain |
| 2011/0081851 A1* | 4/2011 | Franz ................ H05K 7/20145 |
| | | 454/184 |
| 2011/0171899 A1* | 7/2011 | Ye ............................. G06F 1/20 |
| | | 454/284 |
| 2012/0020013 A1* | 1/2012 | Li ...................... H05K 7/20727 |
| | | 361/679.47 |
| 2012/0079314 A1* | 3/2012 | Kamath ............. G06F 11/0793 |
| | | 714/6.1 |
| 2014/0025223 A1 | 1/2014 | Chinnakkonda et al. |
| 2014/0055951 A1* | 2/2014 | Jin .................... H05K 7/20563 |
| | | 361/695 |
| 2014/0073234 A1* | 3/2014 | Elison ................ H05K 7/20727 |
| | | 454/184 |
| 2014/0334093 A1* | 11/2014 | Wei ........................... G06F 1/20 |
| | | 361/679.47 |
| 2014/0361671 A1* | 12/2014 | Degner ..................... G06F 3/00 |
| | | 312/223.2 |
| 2015/0261266 A1* | 9/2015 | Dean ......................... G06F 1/20 |
| | | 361/679.46 |
| 2016/0095250 A1* | 3/2016 | Shelnutt ............ H05K 7/20145 |
| | | 361/679.49 |
| 2016/0174413 A1* | 6/2016 | Steinbrecher ...... H05K 7/20727 |
| | | 361/679.51 |
| 2016/0262286 A1* | 9/2016 | Lin .................... H05K 7/20145 |

* cited by examiner

| Low power | | | | | | | | | | | | |
|---|---|---|---|---|---|---|---|---|---|---|---|---|
| Fan speed (RPM) | Temperature of key components | | | | | | | | | | | |
| | Processors | | | Memory buffers | | | IO Buffers | | | DIMMs | | |
| | 1 | 2 | n | 1 | 2 | n | 1 | 2 | n | 1 | 2 | n |
| Module polarization | | | | | | | | | | | | |
| Angle 1 | | | | | | | | | | | | |
| | | | | | | | | | | | | |
| Angle n | | | | | | | | | | | | |
| Nominal power | | | | | | | | | | | | |
| Fan speed (RPM) | Temperature of key components | | | | | | | | | | | |
| | Processors | | | Memory buffers | | | IO Buffers | | | DIMMs | | |
| | 1 | 2 | n | 1 | 2 | n | 1 | 2 | n | 1 | 2 | n |
| Module polarization | | | | | | | | | | | | |
| Angle 1 | | | | | | | | | | | | |
| | | | | | | | | | | | | |
| Angle n | | | | | | | | | | | | |
| High power | | | | | | | | | | | | |
| Fan speed (RPM) | Temperature of key components | | | | | | | | | | | |
| | Processors | | | Memory buffers | | | IO Buffers | | | DIMMs | | |
| | 1 | 2 | n | 1 | 2 | n | 1 | 2 | n | 1 | 2 | n |
| Module polarization | | | | | | | | | | | | |
| Angle 1 | | | | | | | | | | | | |
| | | | | | | | | | | | | |
| Angle n | | | | | | | | | | | | |

IMPLEMENTING DIMM AIR FLOW BAFFLE

This application is a continuation application of Ser. No. 14/611,480 filed Feb. 2, 2015.

FIELD OF THE INVENTION

The present invention relates generally to the data processing field, and more particularly, relates to a method, system and computer program product for implementing thermal air flow control management of a computer system, such as a server computer system, based upon system thermal conditions.

DESCRIPTION OF THE RELATED ART

Traditional thermal management in a server is designed to cool down components of three major subsystems including the processor, memory and Input Output (IO).

Fan arrangements and conventional stacking of modules allows incoming air to flow to memory subsystem first, then pre-heat air to processor subsystem and then to IO. This method though ensures uniform air flow across modules of these subsystems, but it lacks the ability to increase the amount of air flow to cool down one or more components rapidly (or vice versa), if needed. This leads to sub-optimal performance or energy savings.

Figure 9:
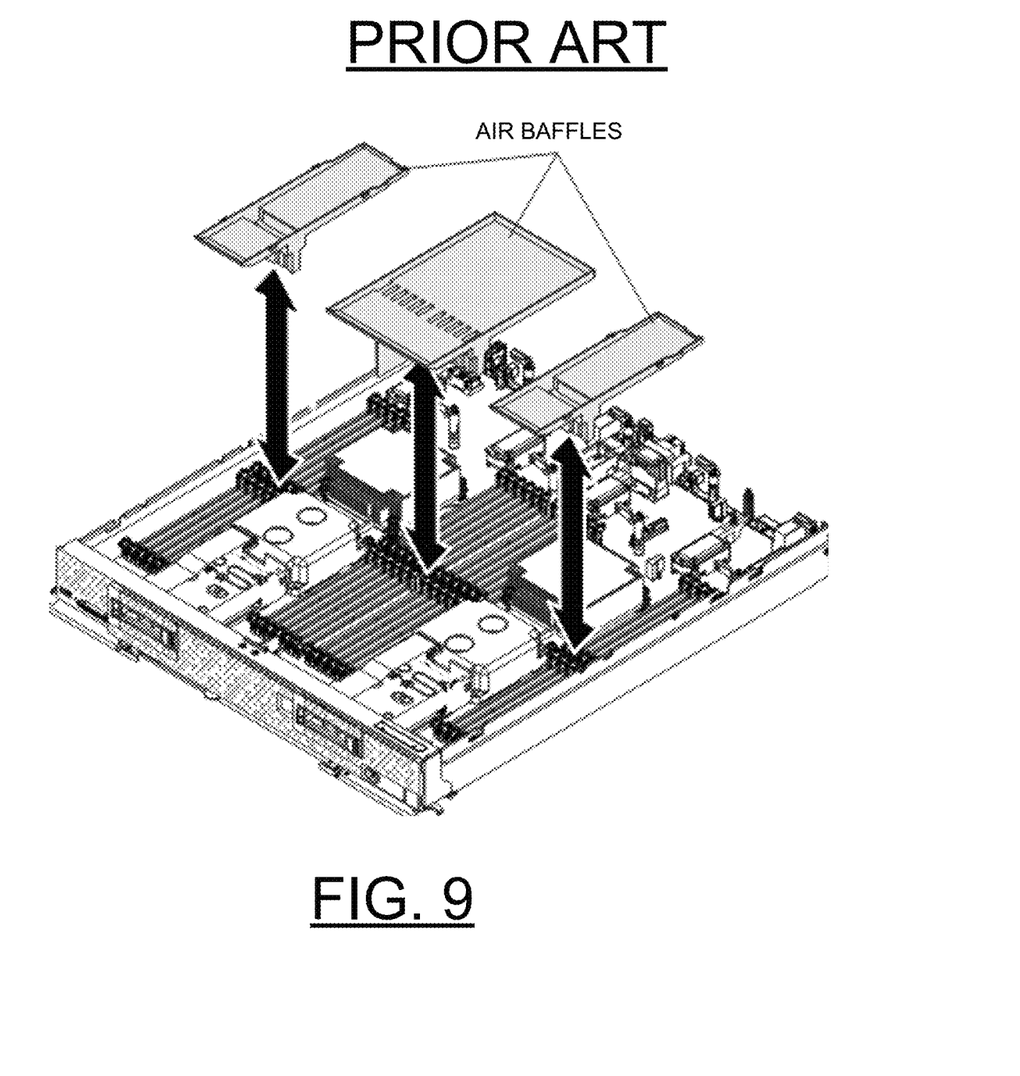
FIGS. 9 and 10 illustrate prior art air baffles including DIMM air baffles.
Figure 10:
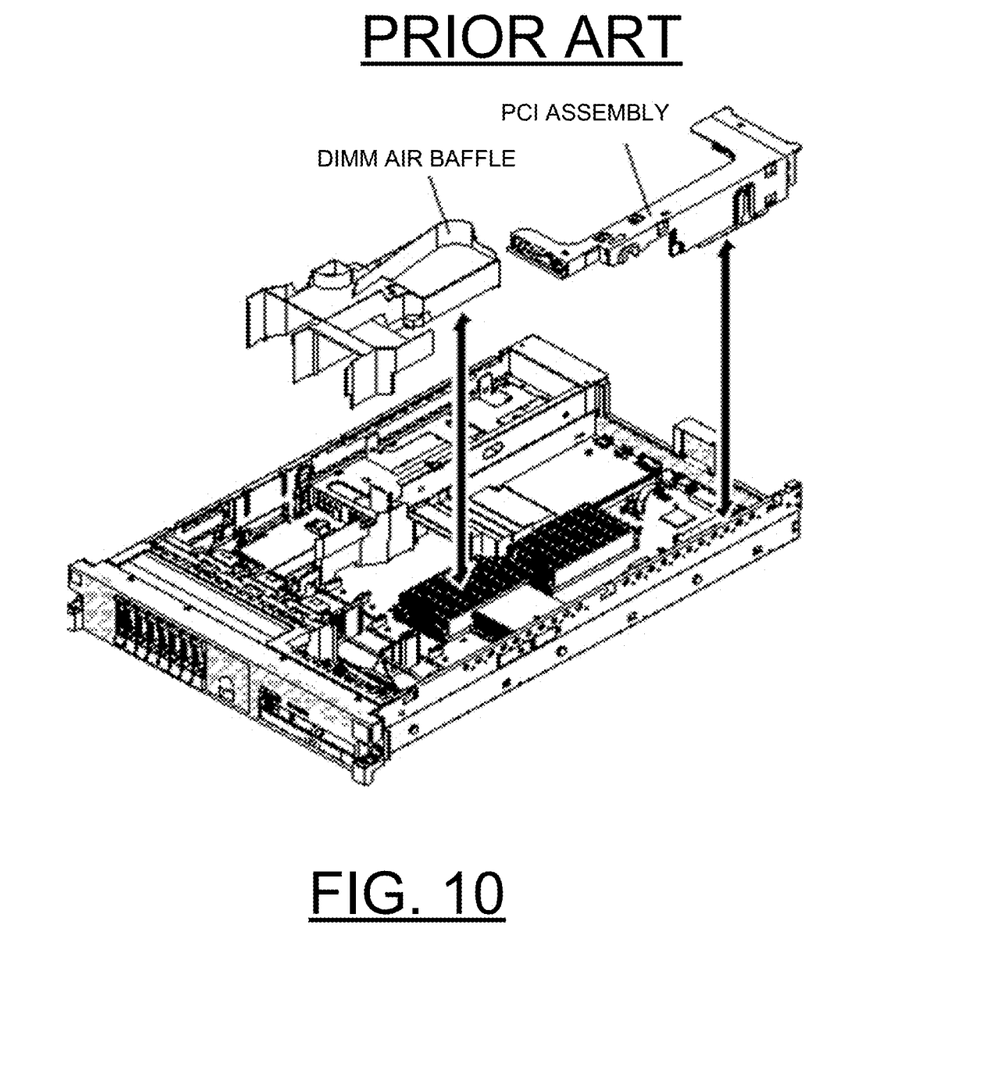

A dual in-line memory-module (DIMM) air baffle is a known art and very widely used technique in server systems. For example, FIGS. 9 and 10 illustrate prior art air baffles including DIMM air baffles.

Whenever computer system components, such as processors, buffers, DIMM modules, and the like of a server system get hotter, the thermal management device employs several mechanisms to reduce or bring down the temperature. One widely adopted technique is to ramp the speed of fans to their fullest speed, so that the increased air flow helps in reducing the temperature of the hotter modules. However even with fullest fan speed, there may be situations, where the temperature of hotter components keeps increasing beyond certain safe threshold limits.

Several techniques are used to encounter such situations and throttling is one of the widely adopted techniques to overcome this situation. Though this technique is very useful to overcome any thermal runaway conditions, with throttling, the system performance would be degraded heavily, which is not desirable in customer environments.

A need exists for an efficient and effective mechanism for implementing enhanced thermal management of a computer system, such as a server computer system.

SUMMARY OF THE INVENTION

Principal aspects of the present invention are to provide a method, system and computer program product for implementing thermal air flow control management of a computer system, such as a server computer system, based upon system thermal conditions. Other important aspects of the present invention are to provide such method, system and computer program product substantially without negative effects and that overcome many of the disadvantages of prior art arrangements.

In brief, a method, system and computer program product for implementing thermal air flow control management of a computer system. A temperature profile of the server system is identified. One or more dual in-line memory-modules (DIMMs) are used to pivot on an axis to direct air flow to cool hot spots based upon the temperature profile of the server system.

In accordance with features of the invention, the temperature profile of the server system includes multiple temperature and power settings of components used to generate boundary values and stored as a parametric table. Firmware interpolates the parametric table during system runtime to determine an angle position of the DIMMs.

In accordance with features of the invention, a baffle polarizer unit (BFU) directs the position of DIMMs to control air flow. BFU leverages pre-characterized data to identify the angle of polarization of one or more modules or DIMMs.

In accordance with features of the invention, when determined that the memory subsystem usage is higher as compared to processor and IO modules, BFU exploits hotness profile of memory modules and pre-characterization data to determine angle and position DIMMs, in such a way that one or more modules have enough air flow to cool down before it reaches a pre-determined event threshold, for example, where a throttle event would occur.

In accordance with features of the invention, when determined that the processor and/or IO subsystems usage is higher compared to memory, BFU exploits hotness profile of processor and/or IO modules and pre-characterization data to determine angle and position DIMMs, in such a way that one or more processor and/or IO modules have enough air flow to cool down before it reaches a pre-determined event threshold, for example, where a throttle event would occur.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In accordance with features of the invention, a method and apparatus are provided for implementing thermal air flow control management in a computer system.

Figure 1:
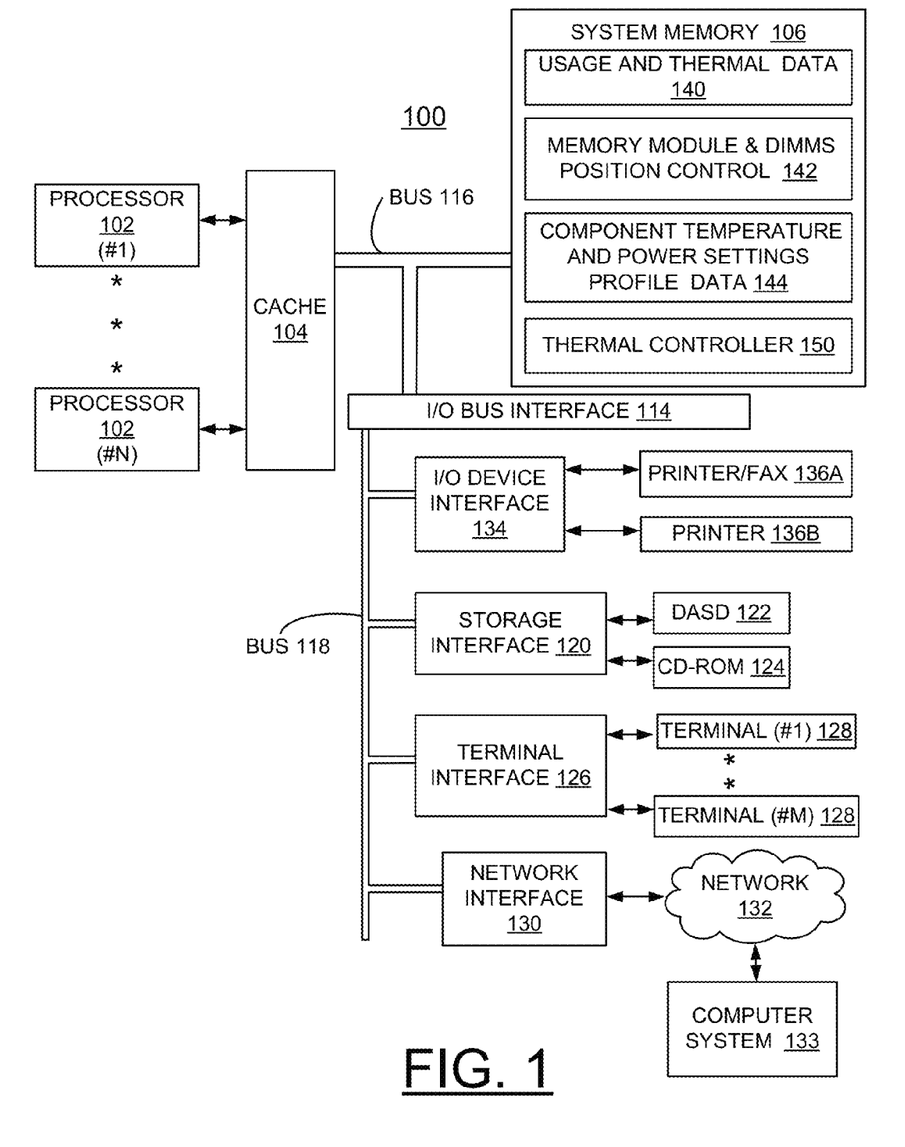
FIG. 1 is a block diagram of an example computer system for implementing thermal air flow control management in accordance with preferred embodiments.

Having reference now to the drawings, in FIG. 1, there is shown a computer system embodying the present invention generally designated by the reference character 100 for implementing thermal air flow control management in accordance with the preferred embodiment. Computer system 100 includes one or more processors 102 or general-purpose programmable central processing units (CPUs) 102, #1-N. As shown, computer system 100 includes multiple processors 102 typical of a relatively large system; however, system 100 can include a single CPU 102. Computer system 100 includes a cache memory 104 connected to each processor 102.

Computer system 100 includes a system memory 106. System memory 106 is a random-access semiconductor memory for storing data, including programs. System memory 106 is comprised of, for example, a dynamic random access memory (DRAM), a synchronous direct random access memory (SDRAM), a current double data rate (DDRx) SDRAM, non-volatile memory, optical storage, and other storage devices.

I/O bus interface 114, and buses 116, 118 provide communication paths among the various system components. Bus 116 is a processor/memory bus, often referred to as front-side bus, providing a data communication path for transferring data among CPUs 102 and caches 104, system memory 106 and I/Obus interface unit 114. I/O bus interface 114 is further coupled to system I/O bus 118 for transferring data to and from various I/O units.

As shown, computer system 100 includes a storage interface 120 coupled to storage devices, such as, a direct access storage device (DASD) 122, and a CD-ROM 124. Computer system 100 includes a terminal interface 126 coupled to a plurality of terminals 128, #1-M, a network interface 130 coupled to a network 132, such as the Internet, local area or other networks, shown connected to another separate computer system 133, and a I/O device interface 134 coupled to I/O devices, such as a first printer/fax 136A, and a second printer 136B.

I/O bus interface 114 communicates with multiple I/O interface units 120, 126, 130, 134, which are also known as I/O processors (IOPs) or I/O adapters (IOAs), through system I/O bus 116. System I/O bus 116 is, for example, an industry standard PCI bus, or other appropriate bus technology.

Figure 2:
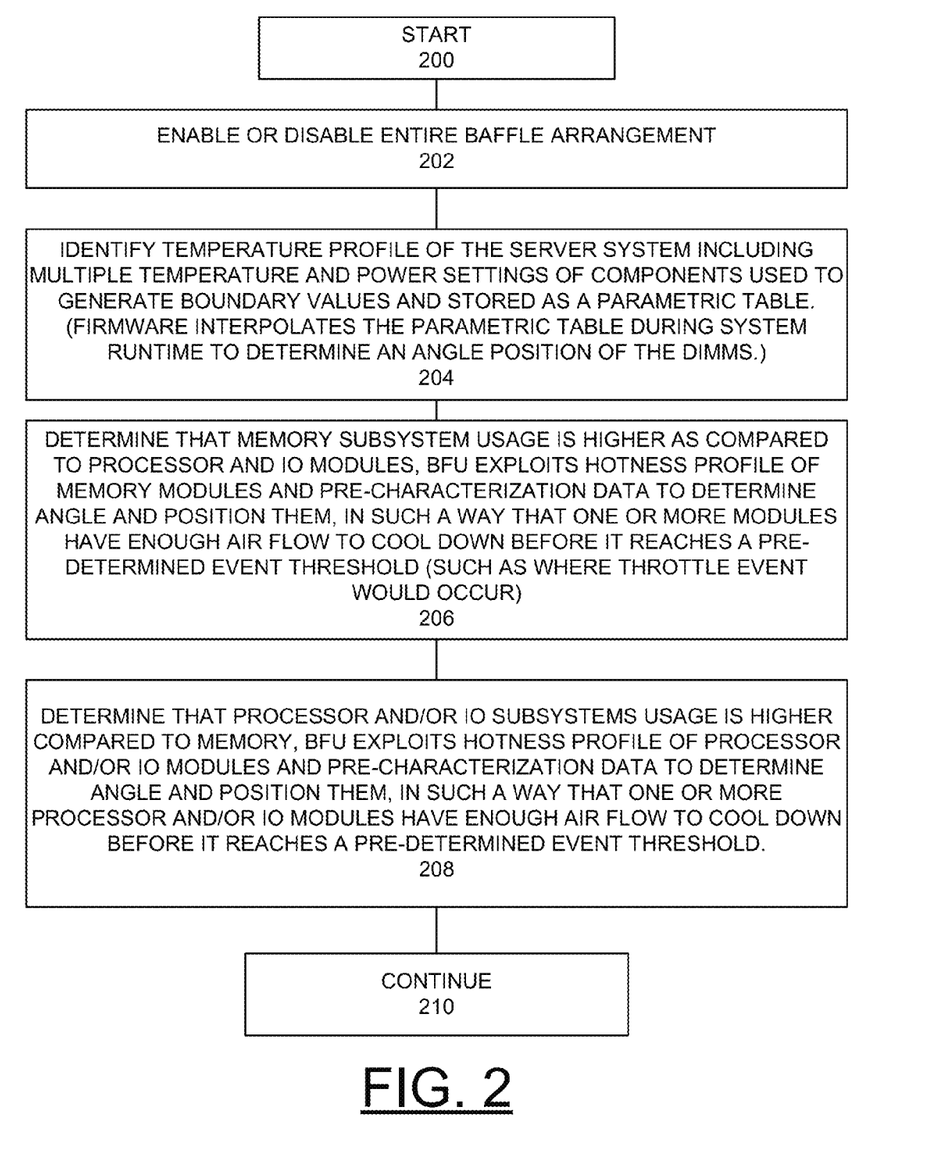
FIG. 2 is a flow chart illustrating example system operations of the computer system of FIG. 1 for implementing thermal air flow control management in accordance with preferred embodiments.
Figure 3:
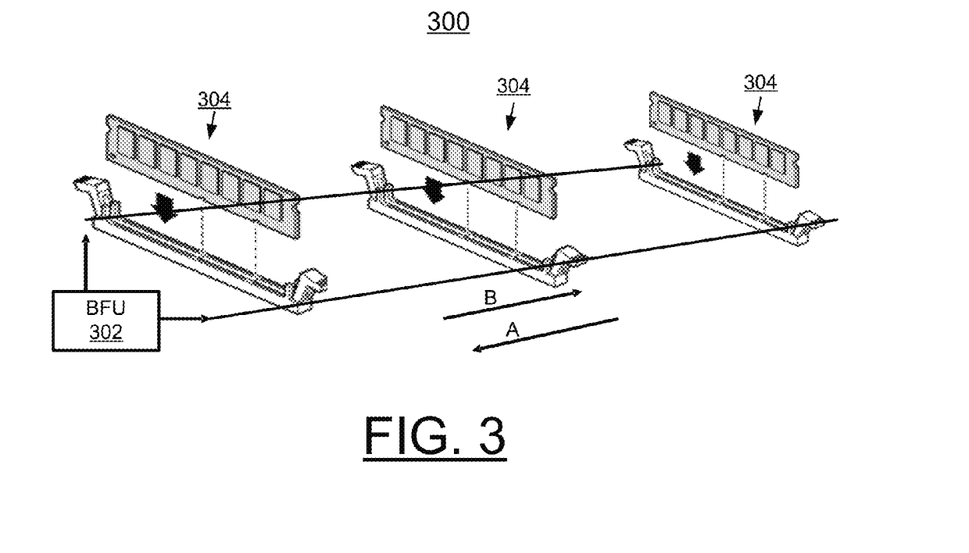
FIG. 3 is a schematic and block diagram of example hardware used for implementing thermal air flow control management in accordance with preferred embodiments.
Figure 5:
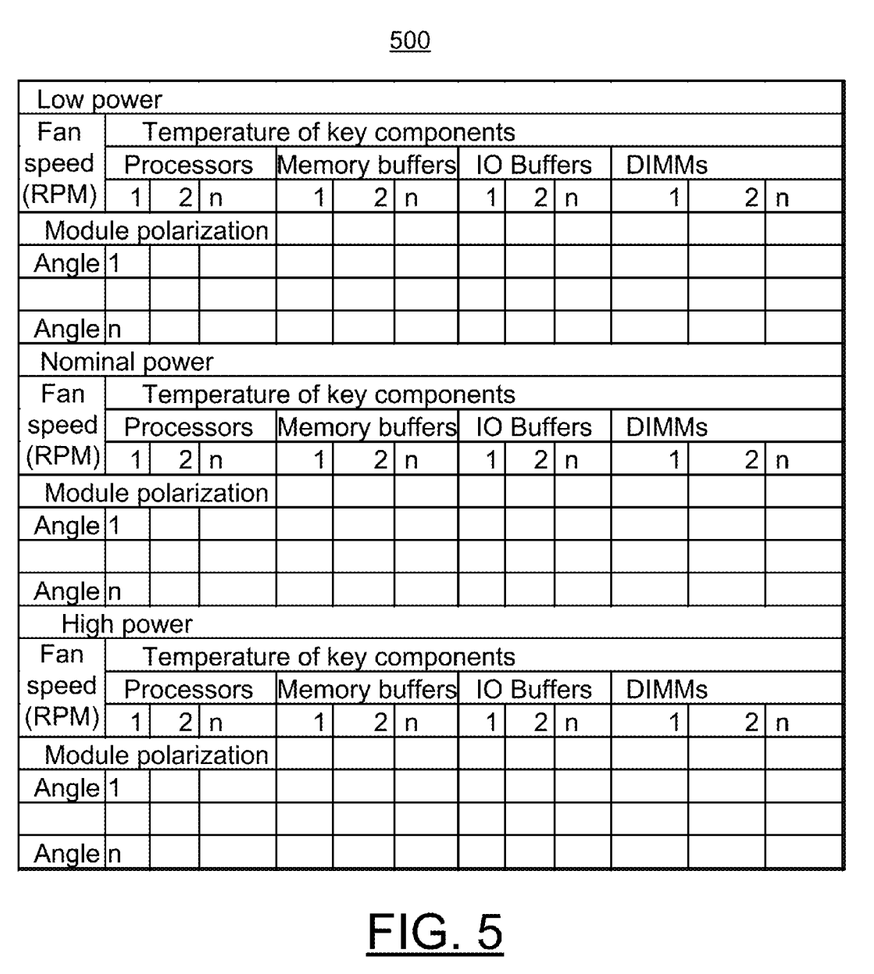
FIGS. 5 and 6 are charts illustrating example pre-characterization multiple temperature and power settings of components used to generate boundary values of the computer system of FIG. 1 for implementing thermal air flow control management in accordance with preferred embodiments.
Figure 6:
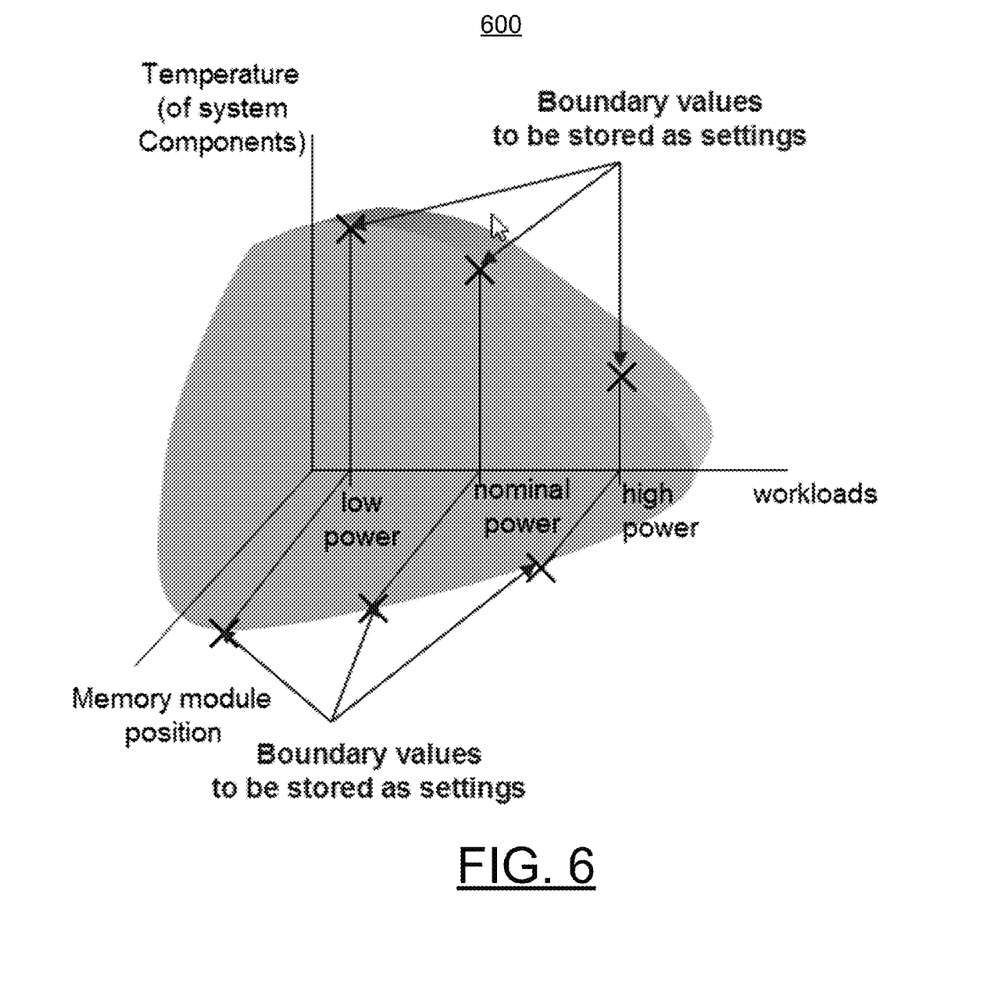

System memory 106 stores usage and thermal data 140 of system components and subsystems including memory, processor and IO modules, memory module and DIMMs position control 142, including such as a baffle polarizer unit (BFU) illustrated and described with respect to FIGS. 2 and 3, component temperature and power settings profile 144 of the computer system, such as illustrated and described with respect to FIGS. 5 and 6, and a thermal controller 150 for implementing enhanced thermal air flow control management in a computer system in accordance with the preferred embodiments.

In accordance with features of the invention, implementing enhanced thermal air flow control management is provided using one or more dual in-line memory-modules (DIMMs) or one or more DIMM baffle, which can rotate and move around based on a temperature profile of the computer system 100.

Referring to FIG. 2, there are shown example system operations of the computer system of FIG. 1 for implementing thermal air flow control management in accordance with preferred embodiments starting at a block 200. As indicated in a block 202 the entire baffle arrangement can be enabled or disabled through firmware. In operation with the baffle use enabled, a temperature profile of the computer system is identified including multiple temperature and power settings of components used to generate boundary values and stored as a parametric table as indicated in a block 204. Firmware interpolates the parametric table during system runtime to determine an angle position of the DIMMs.

As indicated in a block 206 when it is determined that the memory subsystem usage is higher as compared to processor and IO modules, the BFU exploits hotness profile of memory modules and pre-characterization or profile data to determine angle and position of DIMMs, in such a way that one or more modules have enough air flow to cool down before it reaches a pre-determined event threshold, for example, where a throttle event would occur.

As indicated in a block 208, when it is determined that the processor and/or IO subsystems usage is higher compared to memory, BFU exploits hotness profile of processor and/or IO modules and pre-characterization data to determine angle and position DIMMs, in such a way that one or more processor and/or IO modules have enough air flow to cool down before it reaches a pre-determined event threshold, for example, where a throttle event would occur. Operations continue as indicated in a block 210.

Referring now to FIG. 3, there are shown example hardware generally designated by the reference character 300 used for implementing thermal air flow control management in accordance with preferred embodiments. A baffle polarizer unit (BFU) 302 is shown with a plurality of dual in-line memory-modules (DIMMs) 304. As schematically indicated by arrows labeled A and B, the baffle or DIMMs 304 are pivoted to an angle of polarization operatively controlled by the BFU 302.

Figure 4:
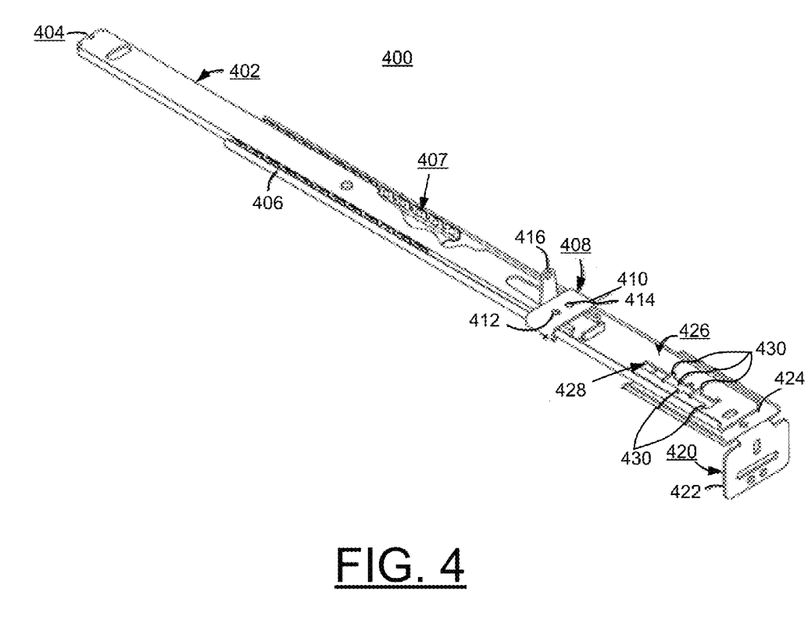
FIG. 4 is a schematic diagram of other example hardware used for implementing thermal air flow control management in accordance with preferred embodiments.

Referring now to FIG. 4, there is shown example hardware generally designated by the reference character 400 used for implementing thermal air flow control management in accordance with preferred embodiments. Example hardware 400 includes, for example, an available drawer slider arrangement modified for implementing thermal air flow control management in accordance with preferred embodiments.

Example hardware 400 includes a moveable member 402 having a free end 404 for moving forward and backward in a rail member 406 with a plurality of sensor point 407 placed in the rail 406. A connect assembly 408 includes a bracket 410 having openings 412, 414 for receiving fasteners to limit a position of a stop member 416. A mounting assembly 420 at an opposite end from free end 404 includes a downwardly extending flange 422 and a rail member 424, for example receiving another moveable member 426. The moveable member 426 includes, for example, a slot 428 including a plurality of notches 430 as sensor points such as directly related to thermal distribution of the computer system.

Referring now to FIGS. 5 and 6, there are shown charts illustrating example system profile data respectively generally designated by the reference character 500, 600 of the computer system of FIG. 1 used for implementing thermal air flow control management in accordance with preferred embodiments. Profile data 500, and workload boundary value data 600 include low power, nominal power and high power each including fan speed, together with multiple temperatures of key components, such as processors 1-$n$, memory buffers 1-$n$, IO buffers 1-$n$, and DIMMs 1-$n$, and Module polarization angles 1-$n$.

Figure 7:
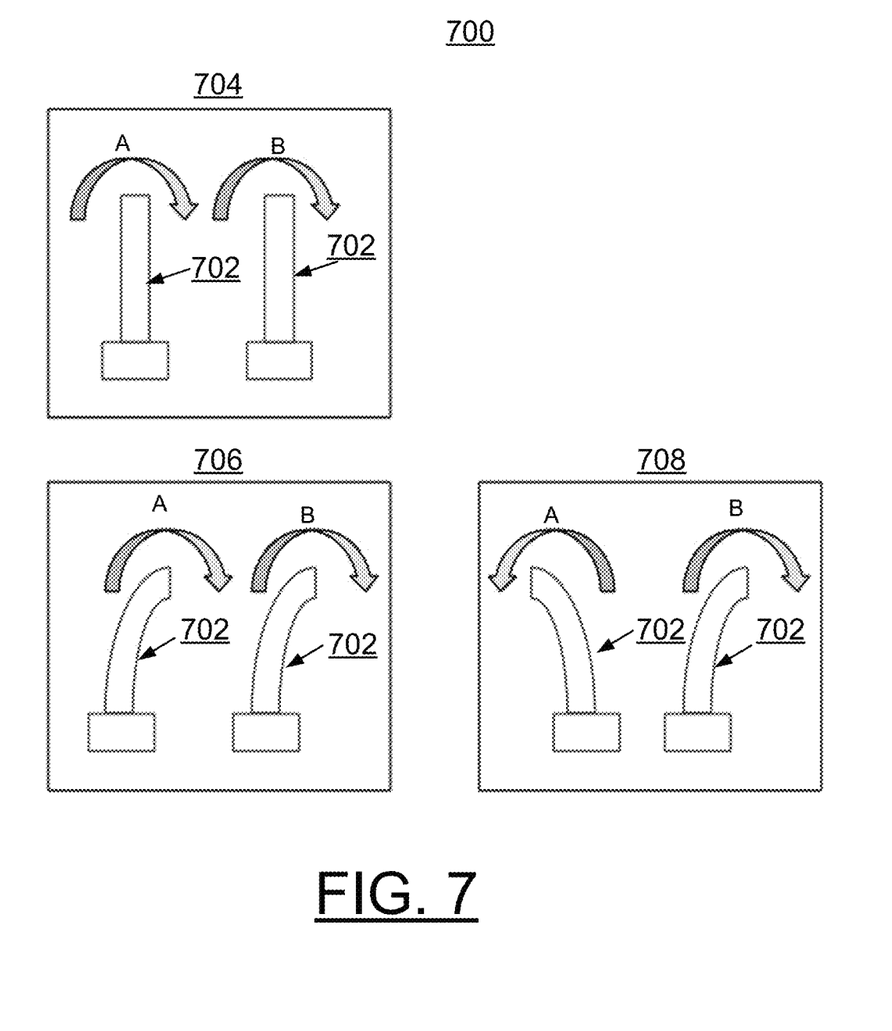
FIG. 7 is a schematic and block diagram of example hardware used for implementing thermal air flow control management in accordance with preferred embodiments.

Referring now to FIG. 7, there is shown example hardware used generally designated by the reference character 700 for implementing thermal air flow control management in accordance with preferred embodiments. Hardware 700 includes flexible DIMMs 702. As schematically indicated by arrows labeled A and B, the flexible DIMMs 702 are pivoted to any desired angle of polarization with respective illustrated example thermal air flow control positions 704, 706, and 708 for the flexible DIMMs 702.

Figure 8:
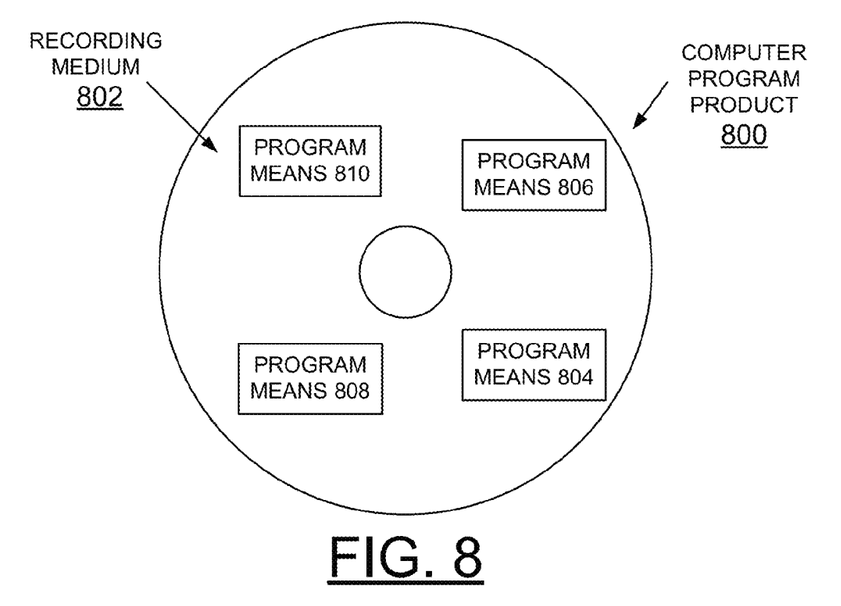
FIG. 8 is a block diagram illustrating a computer program product in accordance with the preferred embodiment.

Referring now to FIG. 8, an article of manufacture or a computer program product 800 of the invention is illustrated. The computer program product 800 is tangibly embodied on a non-transitory computer readable storage medium that includes a recording medium 802, such as, a floppy disk, a high capacity read only memory in the form of an optically read compact disk or CD-ROM, a tape, or another similar computer program product. Recording medium 802 stores program means 804, 806, 808, and 810 on the medium 802 for carrying out the methods for implementing enhanced thermal air flow control management of the preferred embodiment in the system 100 of FIG. 1.

A sequence of program instructions or a logical assembly of one or more interrelated modules defined by the recorded program means 804, 806, 808, and 810, direct the system 100 for implementing enhanced thermal air flow control management of the preferred embodiment.

While the present invention has been described with reference to the details of the embodiments of the invention shown in the drawing, these details are not intended to limit the scope of the invention as claimed in the appended claims.

What is claimed is:

1. A computer-implemented method for implementing enhanced thermal air flow control management of a computer system comprising:
   providing a plurality of dual in-line memory-modules (DIMMs); said plurality of dual in-line memory-modules (DIMMs) including flexible DIMMs and being pivoted to a desired angle of polarization for thermal air flow control positions;
   identifying a temperature profile of the computer system;
   identifying hot spots in the computer system; and
   pivoting one or more of said dual in-line memory-modules (DIMMs) to cool identified hot spots based upon the temperature profile of the server system.

2. The method as recited in claim 1 wherein identifying a temperature profile of the computer system includes identifying multiple temperature and power settings of components, and generating boundary values using said multiple temperature and power settings of components.

3. The method as recited in claim 2 includes storing a parametric table including said boundary values and said multiple temperature and power settings of components.

4. The method as recited in claim 3 wherein pivoting one or more of said dual in-line memory-modules (DIMMs) to cool identified hot spots based upon the temperature profile of the server system includes interpolating the parametric table during system runtime to determine an angle position of said one or more dual in-line memory-modules (DIMMs).

5. The method as recited in claim 1 includes providing a baffle polarizer unit (BPU) for directing a position of DIMMs to control air flow.

6. The method as recited in claim 5 wherein pivoting one or more of said dual in-line memory-modules (DIMMs) to cool identified hot spots based upon the temperature profile of the server system includes responsive to identifying memory subsystem usage being higher as compared to processor and 10 modules, said BPU using said temperature profile of the computer system including a hotness profile of memory modules to determine an angle and position said one or more dual in-line memory-modules (DIMMs).

7. The method as recited in claim 6 includes providing one or more modules having predefined air flow to cool down the memory subsystem before a pre-determined event threshold is reached.

8. The method as recited in claim 5 wherein pivoting one or more of said dual in-line memory-modules (DIMMs) to cool identified hot spots based upon the temperature profile of the server system includes responsive to identifying processor and 10 modules usage being higher as compared to a memory subsystem, said BPU using said temperature profile of the computer system including a hotness profile of said processor and 10 modules to determine an angle and position said one or more dual in-line memory-modules (DIMMs).

9. The method as recited in claim 8 includes providing one or more modules having predefined air flow to cool down the processor and 10 modules before a pre-determined event threshold is reached.

* * * * *